United States Patent
Harper et al.

(10) Patent No.: US 10,337,886 B2
(45) Date of Patent: Jul. 2, 2019

(54) ACTIVE PROXIMITY SENSOR WITH ADAPTIVE ELECTRIC FIELD CONTROL

(71) Applicant: Microsoft Technology Licensing, LLC, Redmond, WA (US)

(72) Inventors: Marc Harper, Seattle, WA (US); Steven J. Shankle, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 122 days.

(21) Appl. No.: 15/413,196

(22) Filed: Jan. 23, 2017

(65) Prior Publication Data
US 2018/0209817 A1    Jul. 26, 2018

(51) Int. Cl.
*G01D 5/14*    (2006.01)
*G01R 29/12*    (2006.01)
(Continued)

(52) U.S. Cl.
CPC ............... *G01D 5/14* (2013.01); *G01R 29/12* (2013.01); *G01S 13/04* (2013.01); *G01S 13/42* (2013.01);
(Continued)

(58) Field of Classification Search
CPC .. G01D 5/00; G01D 5/12; G01D 5/14; G01D 5/24; G01D 5/241; G01D 5/2412; G01R 29/00; G01R 29/12; G01R 29/14; G01S 13/00; G01S 13/02; G01S 13/04; G01S 13/06; G01S 13/42; G01S 13/46;
(Continued)

(56) References Cited

U.S. PATENT DOCUMENTS

| 4,016,490 A | 4/1977 | Weckenmann et al. |
| 5,166,679 A | 11/1992 | Vranish et al. |

(Continued)

FOREIGN PATENT DOCUMENTS

| AU | 2014202603 B2 | 7/2015 |
| CN | 1179864 A | 4/1998 |

(Continued)

OTHER PUBLICATIONS

Ban, et al., "A Dual-Loop Antenna Design for Hepta-Band WWAN/LTE Metal-Rimmed Smartphone Applications", In Journal of IEEE Transactions on Antennas and Propagation, vol. 63, Issue 1, Jan. 2015, 8 pages.

(Continued)

*Primary Examiner* — Hoai-An D. Nguyen
(74) *Attorney, Agent, or Firm* — Holzer Patel Drennan

(57) ABSTRACT

A proximity sensor assembly includes a proximity sensor, an insulating layer, and at least one segmented electrode. The proximity sensor is configured to generate an electric field emanating from the proximity sensor assembly. The insulating layer is in overlapping contact with at least one surface of the proximity sensor. A segmented electrode having two or more segments is in overlapping contact with the insulating layer and overlapping the proximity sensor. At least a first segment of the segmented electrode is configured to direct the electric field emanating from the proximity sensor and at least a second segment of the segmented electrode is configured to direct the electric field emanating from the proximity sensor differently than the first segment.

20 Claims, 8 Drawing Sheets

(51) Int. Cl.
| | |
|---|---|
| *G01S 13/04* | (2006.01) |
| *G01S 13/42* | (2006.01) |
| *G01S 13/46* | (2006.01) |
| *H03K 17/955* | (2006.01) |
| *G06F 1/16* | (2006.01) |
| *G06F 3/03* | (2006.01) |
| *H03K 17/96* | (2006.01) |

(52) U.S. Cl.
CPC ............ *G01S 13/46* (2013.01); *G06F 1/1684* (2013.01); *G06F 1/1698* (2013.01); *G06F 3/03* (2013.01); *H03K 17/955* (2013.01); *H03K 2017/9602* (2013.01); *H03K 2217/960705* (2013.01)

(58) Field of Classification Search
CPC ........ G06F 1/1684; G06F 1/1698; G06F 3/03; H03K 17/00; H03K 17/94; H03K 17/945; H03K 17/955; H03K 2017/9602; H03K 2017/960705
USPC ........ 324/600, 649, 658, 660, 661, 662, 686
See application file for complete search history.

(56) References Cited

U.S. PATENT DOCUMENTS

| | | | |
|---|---|---|---|
| 5,212,621 | A | 5/1993 | Panter |
| 5,363,051 | A | 11/1994 | Jenstrom et al. |
| 7,146,139 | B2 | 12/2006 | Nevermann |
| 7,167,093 | B2 | 1/2007 | Fergusson |
| 8,324,549 | B2 | 12/2012 | Romero et al. |
| 8,432,322 | B2 | 4/2013 | Amm et al. |
| 8,466,839 | B2 | 6/2013 | Schlub et al. |
| 8,515,496 | B2 | 8/2013 | Cheng et al. |
| 8,577,289 | B2 | 11/2013 | Schlub et al. |
| 8,630,596 | B2 | 1/2014 | Harel et al. |
| 8,922,443 | B2 | 12/2014 | Zhu et al. |
| 8,975,903 | B2 | 3/2015 | Salter et al. |
| 9,337,833 | B2 | 5/2016 | Siska |
| 9,354,698 | B2 | 5/2016 | Alameh et al. |
| 9,466,872 | B2 | 10/2016 | Sanchez et al. |
| 9,531,420 | B1 | 12/2016 | Prendergast et al. |
| 9,886,156 | B2 | 2/2018 | Standing et al. |
| 10,055,072 | B2 * | 8/2018 | Nakanishi ............... G06F 3/044 |
| 2002/0039028 | A1 | 4/2002 | Douglas et al. |
| 2002/0175814 | A1 | 11/2002 | Wadlow et al. |
| 2003/0214310 | A1 | 11/2003 | McIntosh |
| 2005/0073507 | A1 | 4/2005 | Richter et al. |
| 2007/0037619 | A1 | 2/2007 | Matsunaga et al. |
| 2009/0033562 | A1 | 2/2009 | Takeuchi et al. |
| 2009/0305742 | A1 | 12/2009 | Caballero |
| 2010/0026664 | A1 | 2/2010 | Geaghan |
| 2010/0113111 | A1 | 5/2010 | Wong et al. |
| 2010/0279751 | A1 | 11/2010 | Pourseyed et al. |
| 2010/0321325 | A1 | 12/2010 | Springer et al. |
| 2011/0117973 | A1 | 5/2011 | Asrani et al. |
| 2011/0124363 | A1 | 5/2011 | Calvarese et al. |
| 2012/0021707 | A1 | 1/2012 | Forrester et al. |
| 2012/0044115 | A1 | 2/2012 | McCaughey et al. |
| 2012/0074961 | A1 | 3/2012 | Herrmann |
| 2012/0147801 | A1 | 6/2012 | Ho et al. |
| 2012/0164962 | A1 | 6/2012 | Lin et al. |
| 2012/0172079 | A1 | 7/2012 | Baldemair et al. |
| 2012/0178494 | A1 | 7/2012 | Haim et al. |
| 2012/0214422 | A1 | 8/2012 | Shi et al. |
| 2012/0223865 | A1 | 9/2012 | Li et al. |
| 2012/0231784 | A1 | 9/2012 | Kazmi |
| 2012/0270519 | A1 | 10/2012 | Ngai et al. |
| 2012/0276861 | A1 | 11/2012 | Isobe et al. |
| 2012/0298497 | A1 | 11/2012 | Maeda et al. |
| 2012/0299772 | A1 | 11/2012 | Shtrom et al. |
| 2012/0315847 | A1 | 12/2012 | Li et al. |
| 2012/0329517 | A1 | 12/2012 | Elin |
| 2012/0329524 | A1 | 12/2012 | Kent et al. |
| 2013/0026846 | A1 | 1/2013 | Gianesello et al. |
| 2013/0033400 | A1 | 2/2013 | Chiang |
| 2013/0045700 | A1 | 2/2013 | Stallman et al. |
| 2013/0050046 | A1 | 2/2013 | Jarvis et al. |
| 2013/0051261 | A1 | 2/2013 | Kazmi et al. |
| 2013/0060517 | A1 | 3/2013 | Sanchez |
| 2013/0120257 | A1 | 5/2013 | Park et al. |
| 2013/0122827 | A1 | 5/2013 | Ali et al. |
| 2013/0169348 | A1 | 7/2013 | Shi |
| 2013/0210477 | A1 | 8/2013 | Peter |
| 2013/0217342 | A1 | 8/2013 | Abdul-gaffoor et al. |
| 2013/0278474 | A1 | 10/2013 | Lenormand et al. |
| 2013/0293244 | A1 | 11/2013 | Leek |
| 2013/0310105 | A1 | 11/2013 | Sagae et al. |
| 2014/0021801 | A1 | 1/2014 | Kao et al. |
| 2014/0078094 | A1 | 3/2014 | Yang |
| 2014/0139380 | A1 | 5/2014 | Ouyang et al. |
| 2014/0370929 | A1 | 12/2014 | Khawand et al. |
| 2015/0199042 | A1 | 7/2015 | Standing et al. |
| 2015/0200444 | A1 | 7/2015 | Mercer et al. |
| 2015/0227252 | A1 * | 8/2015 | Ivanov ................. G06F 3/0416 345/174 |
| 2015/0303568 | A1 | 10/2015 | Yarga et al. |
| 2016/0065260 | A1 | 3/2016 | Heikura et al. |
| 2016/0064801 | A1 | 7/2016 | Lee et al. |
| 2016/0204836 | A1 | 7/2016 | Lee et al. |
| 2016/0209962 | A1 * | 7/2016 | Nurmi .................... G06F 3/044 |
| 2017/0082887 | A1 * | 3/2017 | Kubota ................. G06F 3/0416 |
| 2017/0102802 | A1 | 4/2017 | Standing et al. |
| 2018/0046282 | A1 | 2/2018 | Standing et al. |

FOREIGN PATENT DOCUMENTS

| | | |
|---|---|---|
| CN | 1413408 A | 4/2003 |
| CN | 101952455 A | 1/2011 |
| EP | 2276108 A1 | 1/2011 |
| EP | 2383364 A1 | 11/2011 |
| EP | 2568605 A1 | 3/2013 |
| GB | 2518627 A | 4/2015 |
| WO | 2012176217 A1 | 12/2012 |
| WO | 2013103948 | 7/2013 |
| WO | 2013169527 A1 | 11/2013 |
| WO | 2015134117 A1 | 9/2015 |
| WO | 2015138248 A1 | 9/2015 |
| WO | 2016111897 A1 | 7/2016 |

OTHER PUBLICATIONS

Chung, et al., "A dual-mode antenna for wireless charging and Near Field Communication", In Proceedings of EEE International Symposium on Antennas and Propagation & USNC/URSI National Radio Science Meeting, Jul. 24, 2015, 5 pages.

Design of Printed Trace Differential Loop Antennas, http://www.silabs.com/Support%20Documents/TechnicalDocs/AN639.pdf, Retrieved on: Nov. 17, 2016, 28 pages.

"Digital, Silicon Microphone has 2.6 X 1.6mm2 Footprint", Published on: Dec. 28, 2005, Available at: http://news.thomasnet.com/fullstory/Digital-Silicon-Microphone-has-2-6-x-1-6-mm-footprint-471386.

Holopainen, et al., "Broadband Equivalent Circuit Model for Capacitive Coupling Element-Based Mobile Terminal Antenna", In IEEE Antennas and Wireless Propagation Letters, vol. 9, Jul. 8, 2010, 4 pages.

"Low SAR Solution for Tablet PC", Published on: Sep. 27, 2011, Available at: http://www.auden.com.tw/TRC/webspace/disk/AudenSARSolutiondatasheet_110927.pdf.

Mumcu, et al., "Small Wideband Double-Loop Antennas Using Lumped Inductors and Coupling Capacitors", In Journal of IEEE Antennas and Wireless Propagation Letters, vol. 10, Feb. 4, 2011, 5 pages.

Osoinach, Bryce, "Proximity Capacitive Sensor Technology for Touch Sensing Applications", In White Paper of Proximity Sensing, 2007, 7 pages.

Ozyalcin, et al., "SAR Simulations in Wireless Communication and Safety Discussions in the Society", In Proceedings of Turkish

(56) References Cited

OTHER PUBLICATIONS

Journal of Electrical Engineering & Computer Sciences, vol. 10, Issue 2, Dec. 31, 2013, 16 pages.
Pal, et al., "A low-profile switched-beam dual-band capacitively coupled Square Loop Antenna", In Proceedings of Antennas and Propagation Conference, Nov. 11, 2013, 5 Pages.
Pal, et al., "Dual-Band Low-Profile Capacitively Coupled Beam-Steerable Square-Loop Antenna", In Journal of IEEE Transactions on Antennas and Propagation, vol. 62, Issue 3, Mar. 2014, pp. 1204-1211.
Quddious, et al., "An inkjet printed meandered dipole antenna for RF passive sensing applications", In Proceedings of 10th European Conference on Antennas and Propagation, Apr. 2016, 4 Pages.
"Semtech Launches Smart Proximity Sensor for Short-Range Human Presence Detection & SAR Regulations in Mobile & Tablet PC Applications", Published on: Jul. 24, 2012, Available at: http://www.semtech.com/Press-Releases/2012/Semtech-Launches-Smart-Proximity-Sensor-for-Short-Range-Human-Presence-Detection-SAR-Regulations-in-Mobile-Tablet-PC-Applications.html.
Toit, Riaan Du, "Using Proximity Sensing to Meet Mobile Device FCC SAR Reulations", Published on: Apr. 17, 2012, Available at: http://www.eetimes.com/General/PrintView/431201.
"Second Office Action Issued in Chinese Patent Application No. 201380055749.X", dated Jan. 25, 2017, 10 Pages.
First Office Action and Search Report Issued in Chinese Patent Application No. 201480072893.9, dated Apr. 3, 2018, 13 Pages.
International Searching Authority, U.S. Patent and Trademark Office, International Search Report and Written Opinion for PCT/US2014/072413, dated Jul. 16, 2015, 16 pages.
"Second Written Opinion Issued in PCT Application No. PCT/US2015/062851", dated Oct. 28, 2016, 8 Pages.
International Preliminary Examining Authority, International Preliminary Report on Patentability for PCT/US2015/062851, dated Feb. 22, 2017, 19 pages International Preliminary Examining Authority, International Preliminary Report on Patentability for PCT/US2015/062851, dated Feb. 22, 2017, 19 pages.
International Searching Authority, U.S. Patent and Trademark Office, International Search Report and Written Opinion for PCT/US2016/069056, dated Mar. 31, 2017, 17 pages.
International Searching Authority, U.S. Patent and Trademark Office, International Search Report and Written Opinion for PCT/US2018/012854, dated Apr. 10, 2018, 62 pages.
Harper, "Loop Antenna With Integrated Proximity Sensing", U.S. Appl. No. 15/412,997, filed Jan. 23, 2017, 32 pages.
"Non-Final Office Action", U.S. Appl. No. 14/152,652, dated Jul. 16, 2015, 9 pages.
Second Written Opinion Issued in PCT Application No. PCT/US2014/072413, dated Dec. 17, 2015, 6 Pages.
"Final Office Action", U.S. Appl. No. 14/152,652, dated Dec. 23, 2015, 9 pages.
International Preliminary Report on Patentability Issued in PCT Application No. PCT/US2014/072413, dated Mar. 24, 2016, 7 Pages.
"Non-Final Office Action", U.S. Appl. No. 14/152,652, dated Apr. 18, 2016 9 pages.
"Notice of Allowance Issued in U.S. Appl. No. 14/152,652", dated Sep. 23, 2016, 7 Pages.
Non-Final Office Action Issued in U.S. Appl. No. 15/384,742, dated Feb. 10, 2017, 6 Pages.
Non-Final Office Action Issued in U.S. Appl. No. 15/384,742, dated May 30, 2017, 9 Pages.
Notice of Allowance in U.S. Appl. No. 15/384,742, dated Sep. 26, 2017, 7 Pages.
"Non Final Office Action Issued in U.S. Appl. No. 15/793,666", dated Mar. 30, 2018, 7 Pages.
"Non Final Office Action Issued in U.S. Appl. No. 15/793,666", dated Jan. 8, 2018, 6 Pages.
"International Search Report and Written Opinion Issued in PCT Application No. PCT/US2018/012855", dated Apr. 11, 2018, 12 Pages.
Wang, David "FDC1004: Basics of Capacitive Sensing and Applications", In Texas Instruments Application Report, SNOA927, Dec. 2014, 12 pages.
"Non Final Office Action Issued in U.S. Appl. No. 15/412,997", dated Nov. 1, 2018, 8 Pages.
"Final Office Action Issued in U.S. Appl. No. 15/412,997", dated Apr. 5, 2019, 9 Pages.

* cited by examiner

ACTIVE PROXIMITY SENSOR WITH ADAPTIVE ELECTRIC FIELD CONTROL

BACKGROUND

Modern electronic devices typically employ high frequency radio communications, particularly mobile devices. Because human tissue can be negatively impacted (e.g., heated) by strong radiofrequency waves when the tissue is positioned close to a transmitting antenna, various governmental agencies and industry bodies have established standards to limit the radiofrequency (RF) power that is transmitted into human tissue. For example, a Specific Absorption Rate (SAR) test measures the RF power emitted into human tissue that is located in proximity to the RF transmitter. One approach for satisfying such SAR standards involves reducing the RF transmission power when a body (e.g., a human body part) is detected in close proximity to the RF transmitter. However, integrating proximity sensors and circuitry with radio communication components and computing components in the limited real estate of a mobile device is increasingly challenging as mobile devices continue to evolve (e.g., shrink, add functionality, change in certain other industrial design characteristics).

SUMMARY

The described technology provides a system for amplifying directional sensitivity of a capacitive proximity sensor to allow a smaller sensor to sense proximity at a distance similar to that of a larger sensor so as to provide standards-satisfying SAR mitigation. A proximity sensor assembly includes a proximity sensor, an insulating layer, and at least one segmented electrode. The proximity sensor is configured to generate an electric field emanating from the proximity sensor assembly. The insulating layer is in overlapping contact with at least one surface of the proximity sensor. A segmented electrode having two or more segments is in overlapping contact with the insulating layer and overlapping the proximity sensor. At least a first segment of the segmented electrode is configured to direct the electric field emanating from the proximity sensor and at least a second segment of the segmented electrode is configured to direct the electric field emanating from the proximity sensor differently than the first segment.

An electric field is generated to emanate from a proximity sensor of the proximity sensor assembly. The electric field emanates from a proximity sensor of the proximity sensor assembly via a segmented electrode having two or more segments overlapping at least one surface of the proximity sensor and being in overlapping contact with an insulating layer. The insulating layer is positioned between and in overlapping contact with the proximity sensor and the segmented electrode.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

In some jurisdictions, specific absorption rate (SAR) standards impose maximum energy absorption limits on electronic device manufacturers. These standards impose restrictions on the amount of electromagnetic radiation that may be emitted at any particular point within a given distance of a transmitting radio frequency (RF) antenna. Particular attention is given to radiation limits at distances within a few centimeters from the device (e.g., 0-3 centimeters), where users are likely to place a human body part near the transmitting antenna. Such restrictions may be satisfied by reducing transmitted carrier signal strength when a body (e.g., a human body part) is detected in the proximity of the transmitter.

Implementations of the disclosed technology provide an active proximity sensor with adaptive electric field control. The active proximity sensor provides an extended proximity detection field distance (and potentially, a greater proximity detection field volume) over a non-active proximity sensor that lacks adaptive electric field control, given similar proximity sensor surface areas. It should be understood that the electric field employed in implementations of the described technology may emanate from the edge of a proximity sensor or be directed (e.g., through one or more window segments or from differentially-biased directing segments) from any region of a proximity sensor.

Figure 1:
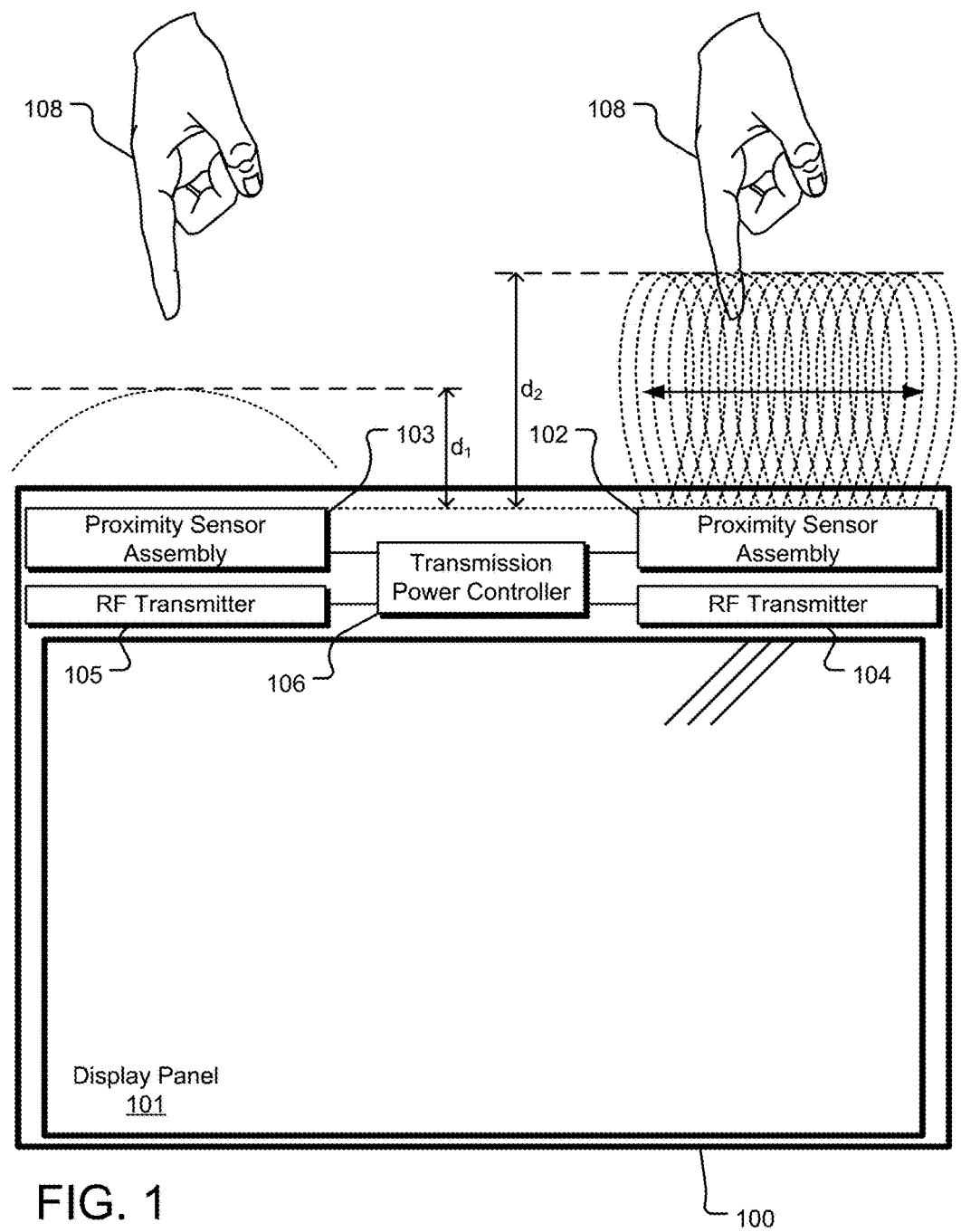
FIG. 1 illustrates an example electronic device having an active proximity sensor system with adaptive electric field control.

FIG. 1 illustrates an example electronic device 100 having an active proximity sensor system with adaptive electric field control. The active proximity sensor system is shown as including a proximity sensor assembly 102, which is responsive to detection of a body or object (referred to generically as "a body 108") in close proximity to the proximity sensor assembly 102. Another proximity sensor assembly 103 is also included in the electronic device 100. In one implementation, the proximity sensor assemblies 102 and 103 include capacitive sensor pads having one or more microwave-transparent layers, made of screened-on polyester material with embedded carbon laid out in 10 to 40 micrometer thick sheets, although other materials and dimensions may be employed. A range of 40 k-ohm to 500 k-ohm per square resistivity may be employed in certain implementations, although various ranges may be employed for other configurations. The materials for the proximity sensor assemblies 102 and/or 103 may be applied as a conductive film, a conductive adhesive, and materials that are sprayed, sputtered, or applied by other means. In at least one implementation, the proximity sensor is made from a material that is substantially transparent to RF radiation (e.g., by having a high resistivity).

The electronic device 100 may be without limitation a tablet computer, laptop, mobile phone, personal data assistant, cell phone, smart phone, Blu-Ray player, gaming system, or any other device including wireless communications circuitry for transmission of an RF carrier wave. A display panel 101 is shown on the front of the electronic device 100 in the illustrated implementation. The electronic device 100 includes RF transmitters 104 and 105 (including a transmitting antenna) that transmits a carrier wave. In one implementation, the carrier wave has a frequency in the range of a mobile telephone RF transmission (e.g., several hundred megahertz (MHz)). Other implementations are also contemplated. In the illustrated implementation, the electronic device 100 represents a tablet computer having mobile telephone RF capabilities, although other types of electronic devices may employ the described technology.

In the illustrated implementation, the proximity sensor assemblies 102 and 103 are co-located with the RF transmitter 104 and 105, respectively, and are capable of detecting proximity of a body 108 (e.g., a human body part) outside the electronic device 100. Because capacitive proximity detection may be based on the presence of a dielectric material within range of a detector, the proximity sensor assemblies 102 and 103 advantageously detect the proximity of bodies with moderate conductivity, such as, for example, a human hand. Co-located refers to overlapping positioning between the proximity sensor assembly and the RF transmitter, whether they are in direct contact or have a thin insulating or non-insulating barrier between them. Various figures are provided that indicate without limitation examples of co-located or overlapping components. Other implementations may employ the described technology without an RF transmitter in the proximity of the proximity sensor assembly. For example, the proximity sensor assembly may be used in a system that does not include an RF transmitter.

Other implementations may be employed with a proximity sensor assembly in the absence of or in a different positional relationship with an RF transmitter. Furthermore, in FIG. 1, the proximity sensor assemblies 102 and 103 are shown in order to distinguish between the structure and operation of the two types of configurations included in the proximity sensor assemblies 102 and 103. In another electronic device, the proximity sensor assemblies 102 and 103 may both have the structure and function described with regard to proximity sensor assembly 102 herein.

The proximity sensor assemblies 102 and 103 include a substantially RF transparent material having an increased resistivity when compared to materials of typical capacitive sensor pads, which can provide effective sensor pad range and performance while making the capacitive sensor pad sufficiently transparent to radiofrequency waves to provide excellent antenna efficiency, despite the co-location of the proximity sensor assembly and the antenna (e.g., an RF transmitter). In one implementation, a range of 40-120 k-ohms per square in the material is effective. The RF transparent material used in a proximity sensor assembly diminishes or eliminates interference or coupling with transmitted RF signals from a proximate RF transmitter.

In one implementation, the proximity sensor assemblies 102 and 103 are fed with an AC voltage waveform, such as a square waveform, having a frequency of generally below 1 MHz (e.g., 200 to 250 kHz) with a voltage swing of about 0-3.6 volts, although other signals are contemplated for driving or configuring the proximity sensor assemblies 102 and 103 to generate an electric field for detecting objects in the proximity. Capacitance is a property that exists between any two conductive surfaces, and capacitance increases as the distance between the two surfaces decreases. In one configuration, the proximity sensor assembly 102 (or 103) acts as a first conductive surface, and a body 108 within a capacitive coupling distance $d_2$ (or $d_1$) to the proximity sensor assembly 102 (or 103) acts as a second conductive surface. Changes in the distance between the two conductive surfaces alter the capacitance, resulting in a detectable AC voltage waveform change at the proximity sensor assembly 102 (or 103) and indicating change in proximity between the proximity sensor assembly 102 (or 103) and the body 108. For example, the increase in capacitance attributed to the closing of the gap between the body 108 and the proximity sensor assembly 102 (or 103) may introduce a delay in the rising and falling edges of the input oscillating waveform, which can be measured as an indication of the proximity of the body 108.

By setting a baseline capacitance, measured in free space (e.g., based on the lack of a body 108 in the proximity of the proximity sensor assembly 102 or 103), and associating that baseline capacitance with a baseline waveform (which may approximate a square waveform), changes in the waveform (e.g., a slower rise or fall time) at the proximity sensor assembly 102 (or 103) can be detected. These changes indicate a "capacitive delta" at the proximity sensor assembly 102 (or 103). The proximity sensor assembly 102 (or 103) is connected to a transmission power controller 106 that provides an electrical feedback path between the proximity sensor assembly 102 (or 103) and the RF transmitter 104 (or 105). If the capacitive delta exceeds a predetermined threshold, the transmission power controller 106 may determine that a body 108, such a human hand, is in proximity to the proximity sensor assembly 102 (or 103) and therefore is in proximity to the co-located RF transmitter 104 (or 105). In addition, the transmission power controller 106 includes control circuitry to vary behavior (e.g., output power level, output wave frequency, etc.) of the RF transmitter 104 (or 105) responsive to the capacitive delta detected by the proximity sensor assembly 102 (or 103), respectively. Therefore, if the transmission power controller 106 determines that the body 108 is in proximity to the RF transmitter 104 (or 105), the transmission power controller 106 can signal the RF transmitter 104 (or 105) to reduce its transmission power in an effort to comply with SAR standards. It should be understood, however, that an active proximity sensor with adaptive electric field control may be used independently of an RF transmitter.

After altering a behavior of the RF transmitter 104 (or 105), the transmission power controller 106 continues to monitor the waveform received by the proximity sensor assembly 102 (or 103). If the body 108 begins to move away from the proximity sensor assembly 102 (or 103), the capacitive coupling between the proximity sensor assembly 102 (or 103) and the body 108 changes toward the baseline capacitance, as indicated by the waveform at the proximity sensor assembly 102 (or 103).

Different types of waveforms and concepts may be used in connection with the proximity sensor assemblies 102 and 103. For example, as described above, the waveform may be a square wave with variable rise and fall times that vary with the effective capacitance, and therefore the proximity, of the body 108. Alternatively, a sinusoid wave may be applied to proximity sensor assembly 102 (or 103). The frequency of the sinusoid wave may vary depending on the effective capacitance, and therefore the proximity, of the proximate body 108. A phase-locked loop circuit or another timing circuit may be used to measure the frequency of the sinusoid wave to, in turn, determine the proximity of the body 108. Any type of waveform may be used, including a sine wave, square wave, saw tooth wave, or a wave that is a combination of sine waves.

In the implementation shown in FIG. 1, the proximity sensor assemblies 102 and 103 are intended to represent proximity sensors having approximately the same physical surface areas for proximity sensing, but the proximity sensor assembly 103 does not include an active proximity sensor with adaptive electric field control, whereas the proximity sensor assembly 102 does include an active proximity sensor with adaptive electric field control. Accordingly, the proximity sensor assembly 103 has a proximity detection field (electric field) distance of $d_1$, whereas the proximity sensor assembly 102 has a proximity detection field distance of $d_2$, where $d_2 > d_1$, despite the proximity sensors having approximately the same physical surface area.

In contrast to the proximity sensor assembly 103, which projects an electric field from substantially the entire surface of the proximity sensor assembly 103 in an approximately non-varying fashion, the proximity sensor assembly 102 constrains emanation of the electric field to a limited surface area of the proximity sensor assembly 102. As described in more detail below, the proximity sensor assembly 102 includes a segmented electrode having two or more segments, and individual segments of the segmented electrode can be actively driven and/or configured to amplify and direct the electric field emanating from the proximity sensor assembly 102 to sweep across the length of the proximity sensor assembly 102 over multiple sweep time periods. In one implementation, the "sweep" can be accomplished by allowing one or more individual segments to float in potential relative to group to operate as window segments, allowing the electric field emanating from the proximity sensor to pass through the windows segment(s). In at least one implementation, a segmented electrode includes two or more segments made from a substantially RF transparent material. Accordingly, the electric field of the proximity sensor assembly 102 can be redirected over multiple sweep time periods to cover substantially the same surface area as the proximity sensor assembly 103, except with a greater proximity detection field distance, resulting in a larger proximity detection volume using a non-directing, non-amplifying proximity detector of substantially the same surface area.

Figure 7:
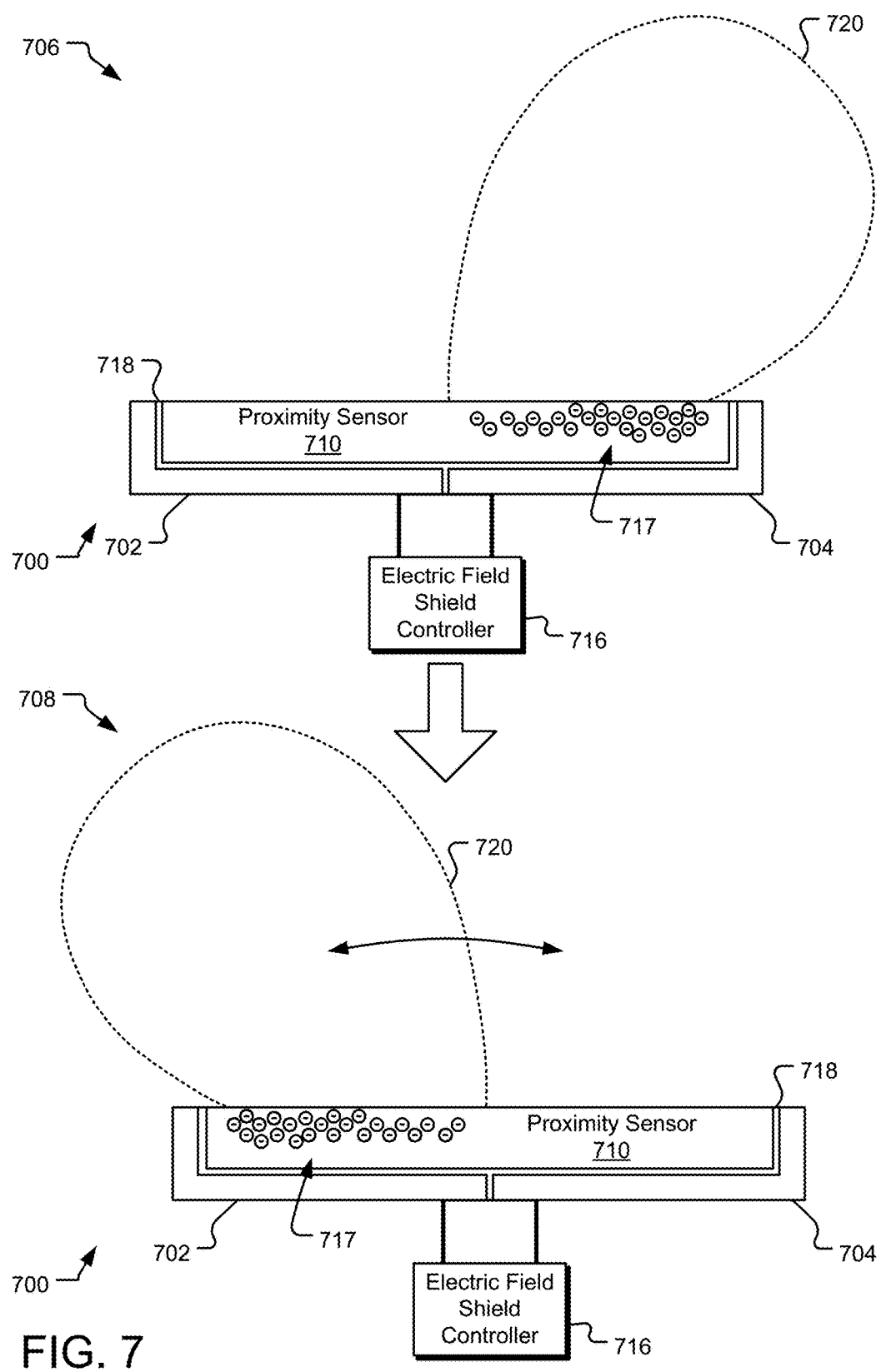
FIG. 7 illustrates an alternative active proximity sensor assembly with two segments.

FIG. 1 shows several discrete electric field cycles sweeping across the proximity sensor assembly 102, although, in alternative implementations, an electric field may angularly sweep across the proximity sensor assembly in a substantially continuous fashion over multiple sweep time periods, as shown in FIG. 7 and the associated description.

Figure 2:
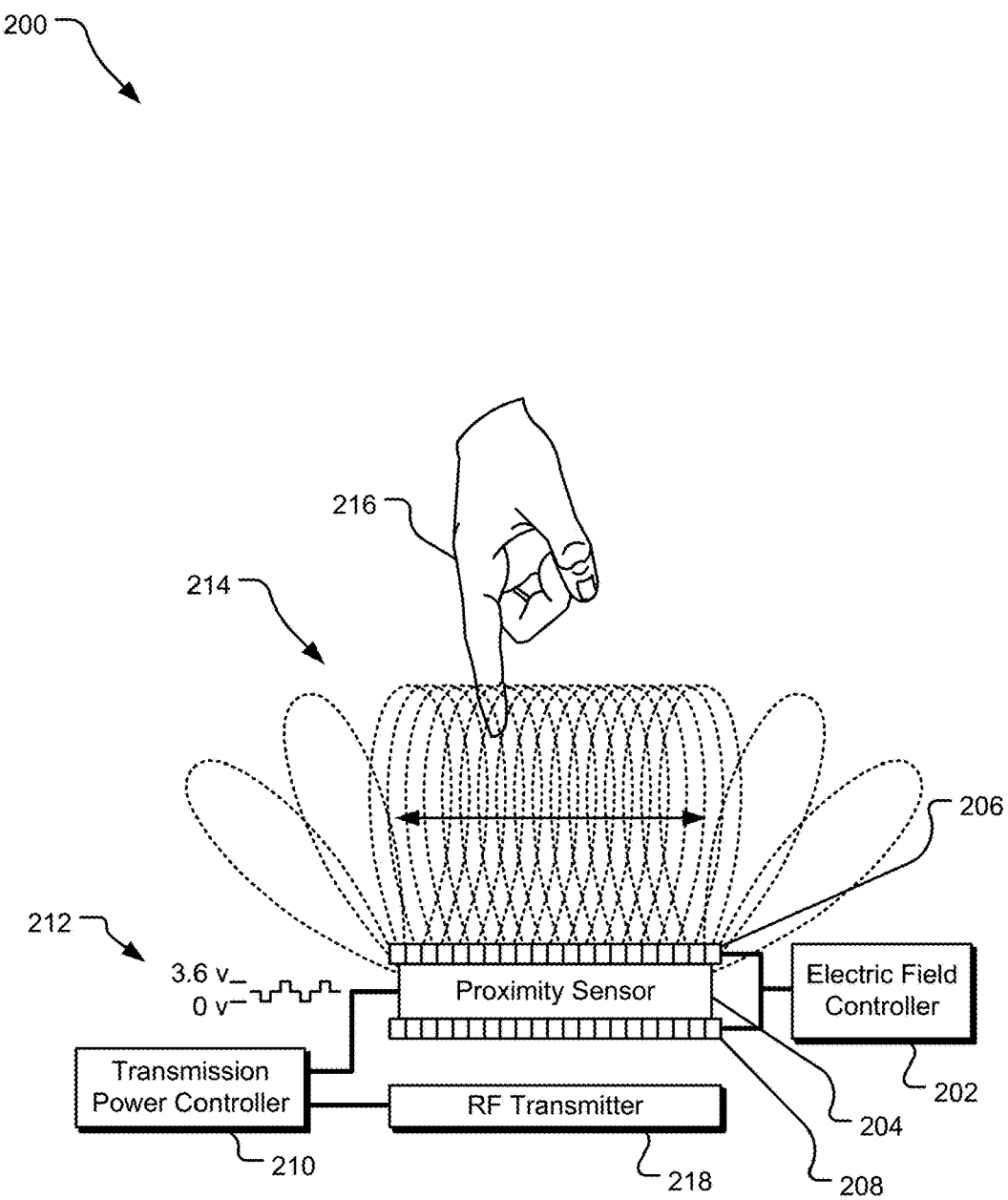
FIG. 2 illustrates an example active proximity sensor system with an electric field controller.

FIG. 2 illustrates an example active proximity sensor system 200 with an electric field controller 202. A proximity sensor 204 is positioned between a segmented electrode 206 and a segmented electrode 208. (The segmented electrode 206 and the segmented electrode 208 are electrically connected via the electric field controller 202 and may be configured as a single segmented electrode in certain implementations.) One or more segments of the segmented electrodes 206 and/or 208 are made from microwave-transparent layers.

A transmission power controller 210 supplies an AC voltage (see, e.g., example AC voltage 212) to the proximity sensor 204 and monitors capacitive changes experienced by the proximity sensor 204 through an electric field 214 emanating from the proximity sensor 204. As a body 216 enters the proximity detection field distance of the proximity sensor 204, the capacitive coupling experienced by the proximity sensor 204 changes, potentially indicating detection of the body 216 in proximity and a need to adjust transmission power of the RF transmitter 218 in order to comply with SAR regulations. If such an adjustment is warranted, the transmission power controller 210 adjusts the transmission power of the RF transmitter 218 accordingly.

The electric field controller 202 controls the electronic signals sent to the individual segments of the segmented electrodes 206 and 208. In one implementation, select segments of the segmented electrode 208 are turned "on" to shield the electric field 214 from emanating through the segments of the segmented electrode 208. In this sense, "on" refers to a segment supplied with a signal at substantially the same frequency, amplitude, and phase as the AC signal being supplied to the proximity sensor 204. Segments operating to shield the electric field are referred to as "shield segments." Such shielding repels the point charges in the proximity sensor 204 away from the segmented electrode 208. In the same implementation, most of the segments of the segmented electrode 206 are also turned "on," also operating as shield segments. In contrast, in the same implementation, one or more segments of the segmented electrode 206 are turned "off" to operate as window segments, which allow the electric field 214 from the proximity sensor 204 to emanate through them. In this sense, "off" refers to a segment that is substantially allowed to float in potential relative to ground and relative to the shield and window segments. Furthermore, because the point charges from the full proximity sensor 204 are repelled from the shield segments and substantially concentrated near the window segment, the electric field 214 emanating through the windows segment is amplified as a result of the concentrated point charges at the window segment. In addition, the electric field 214 is also directed in the sense that the electric field 214 is directed through a window segment, as opposed to simply emanating to the exterior of the proximity sensor assembly from the full surface area of the proximity sensor assembly. For example, in one specific implementation, all segments of the segmented electrodes 206 and 208 are set as shield segments, except one, which is set as a window segment. As such, the electric field 214 is both amplified and directed as it emanates through the window segment, providing an extended proximity detection field distance.

In the illustrated implementation, through a sequence of sweep time periods, segments in the segmented electrodes 206 and/or 208 are toggled between shield segments and window segments to allow the amplified and directed electric field 214 to sweep or otherwise move along a dimension of the proximity sensor 204, including potentially with some angular changes in direction at the ends of the proximity sensor 204. For example, by moving the amplified and directed electric field 214 along the length of the proximity sensor 204, the electric field 214 can scan the proximity detection field through a greater volume than a non-scanning, non-amplifying proximity sensor, because of the field amplification.

An example scan or sweep may be accomplished by turning "off" a segment to make it operate as a window segment while turning "on" the shield segments (e.g., opening the window segment, while closing all of the shield segments). After a period of time, the window segment is turned "on" to operate as a shield segment (e.g., closing the window segment). After another period of time, typically shorter than the "open window" period of time, another segment is turned "on" to operate as a window segment while the other segments are operating as shield segments. Accordingly, the scan can be performed by turning different segments on or off. The new window segment may be adjacent to, proximate to, or distant from the first window segment. Also, multiple segments may be turned "on" as a multi-segment window in some implementations. Example scanning frequencies may be between 1 Hz and 20 Hz, although scanning frequencies outside that range may be employed.

The electric field 214 is three-dimensional as it emanates from the window segment in that the electric field 214 expands along X and Y axes (in the plane of FIG. 2) and along an orthogonal Z axis (in and out of the plane of FIG. 2). As such, a three-dimensional electric field 214 can be scanned across the length of the proximity sensor 204. It should also be noted that the angular directing of the amplified electric field 214 at the opposing ends of the proximity sensor 204 provides an extended proximity detection field distance at the ends of the proximity sensor 204 as compared to a non-scanning, non-amplifying proximity sensor. As such, the proximity detection field of the proximity sensor system 200 achieved through scanning and amplification is applied to a volume that exceeds the proximity detection field volume achieved by a non-scanning, non-amplifying proximity sensor having the same proximity sensor surface area.

Figure 3:
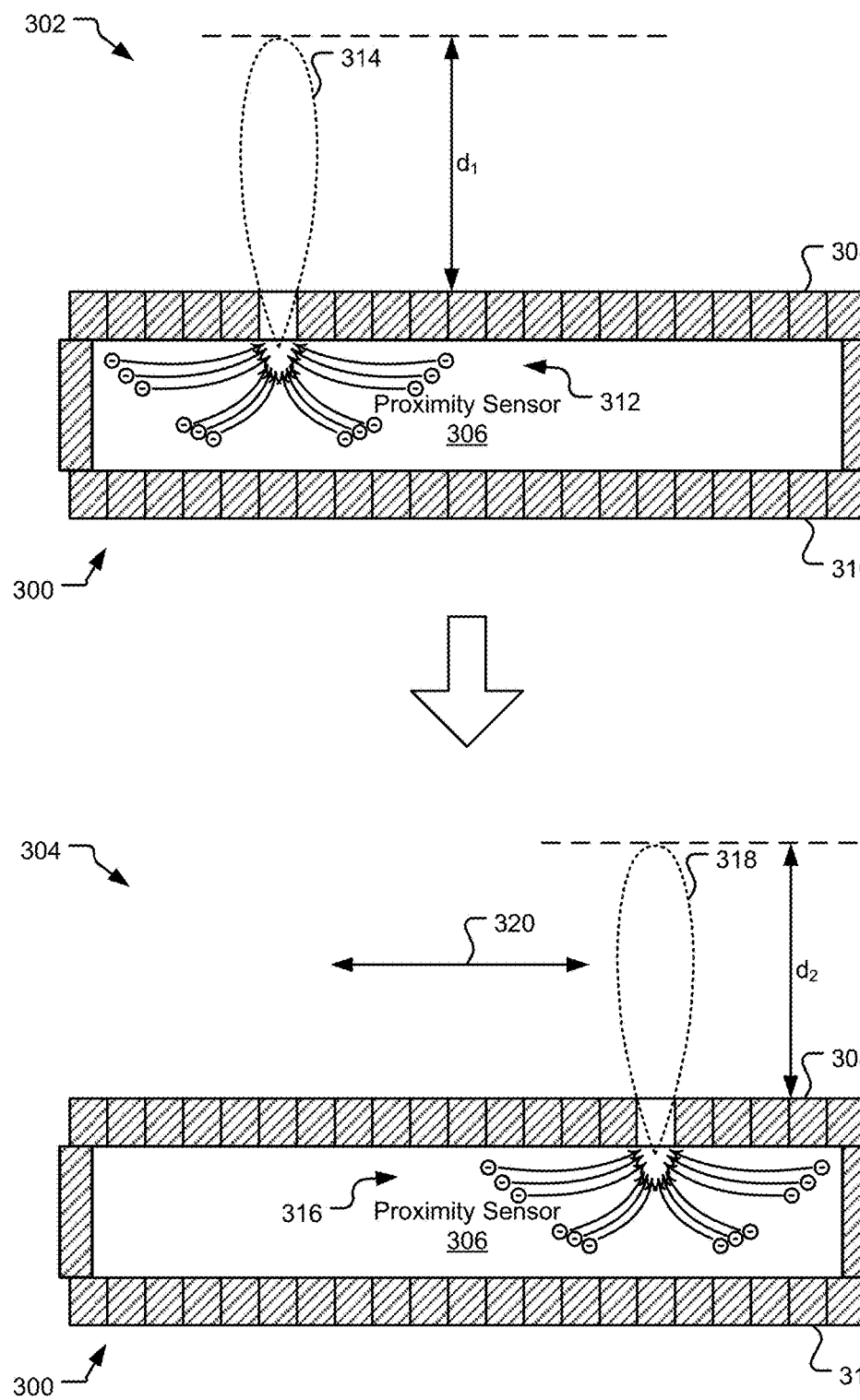
FIG. 3 illustrates an example active proximity sensor assembly with shielding shown in two states to depict example adaptive electric field control.

FIG. 3 illustrates an example active proximity sensor assembly 300 with shielding shown in two states 302 and 304 to depict example adaptive electric field control. In one implementation, an AC signal is input to a proximity sensor 306, and capacitive changes experienced by the proximity sensor 306 are monitored by a transmission power controller to adjust RF transmission power for SAR regulation compliance.

Two segmented electrodes 308 and 310 sandwich the proximity sensor 306 between them (with appropriate insulating layers), although the two segmented electrodes 308 and 310 may be combined into a single segmented electrode. In one implementation, each segment of the segmented electrodes 308 and 310 is controlled by a distinct signal line from an electric field controller so that the individual segments are individually controlled to operate as shield segments or window segments. It should be understood, however, that in some implementations, control of segments is not limited to individual segments. For example, a distinct signal line may control multiple segments such that a single line can set multiple segments as shield segments or window segments.

In state 302, the cross-hatched segments are turned "on" to configure them as shield segments to shield the electric field from emanating from the proximity sensor 306 through the shield segments. The non-cross-hatched segment is turned "off" to configure it as a window segment to allow the electric field to emanate from the proximity sensor 306 through the window segment. The combination of the shield and window segments concentrates the point charges 312 within the proximity sensor 306 near the window segment, resulting in an amplified electric field 314 that is directed through the window segment into the exterior volume around the proximity sensor assembly 300. As such, the proximity detection field distance $d_1$ is increased in comparison to a non-amplifying proximity sensor assembly.

In state 304, the cross-hatched segments are turned "on" to configure them as shield segments to shield the electric field from emanating from the proximity sensor 306 through the shield segments. The non-cross-hatched segment is turned "off" to configure it as a window segment to allow the electric field to emanate from the proximity sensor 306 through the window segment. The combination of the shield and window segments concentrates the point charges 316 within the proximity sensor 306 near the window segment, resulting in an amplified electric field 318 that is directed through the window segment into the exterior volume around the proximity sensor assembly 300. As such, the proximity detection field distance $d_2$ is increased in comparison to a non-amplifying proximity sensor assembly.

By changing the segments operating as shield segments versus windows segments, the amplified electric field can be scanned (as shown by arrow 320) back and forth across the proximity sensor assembly 300 to monitor proximity within an integrated volume exterior to the proximity sensor assembly 300 over time. FIG. 3 illustrates two states of such an example scanning process, but it should be understood that various scanning processes may be employed including without limitation sequential scanning across the proximity sensor assembly 300 (e.g., one sequential window segment at a time, multiple sequential window segments at a time) and non-sequential scanning across the proximity sensor assembly 300 (e.g., one random window segment at a time, multiple random window segments at a time). Further, window segments may be operated in one or both of the segmented electrodes 308 and 310 (e.g., to allow proximity detection out of both sides of the proximity sensor assembly 306).

Figure 4:
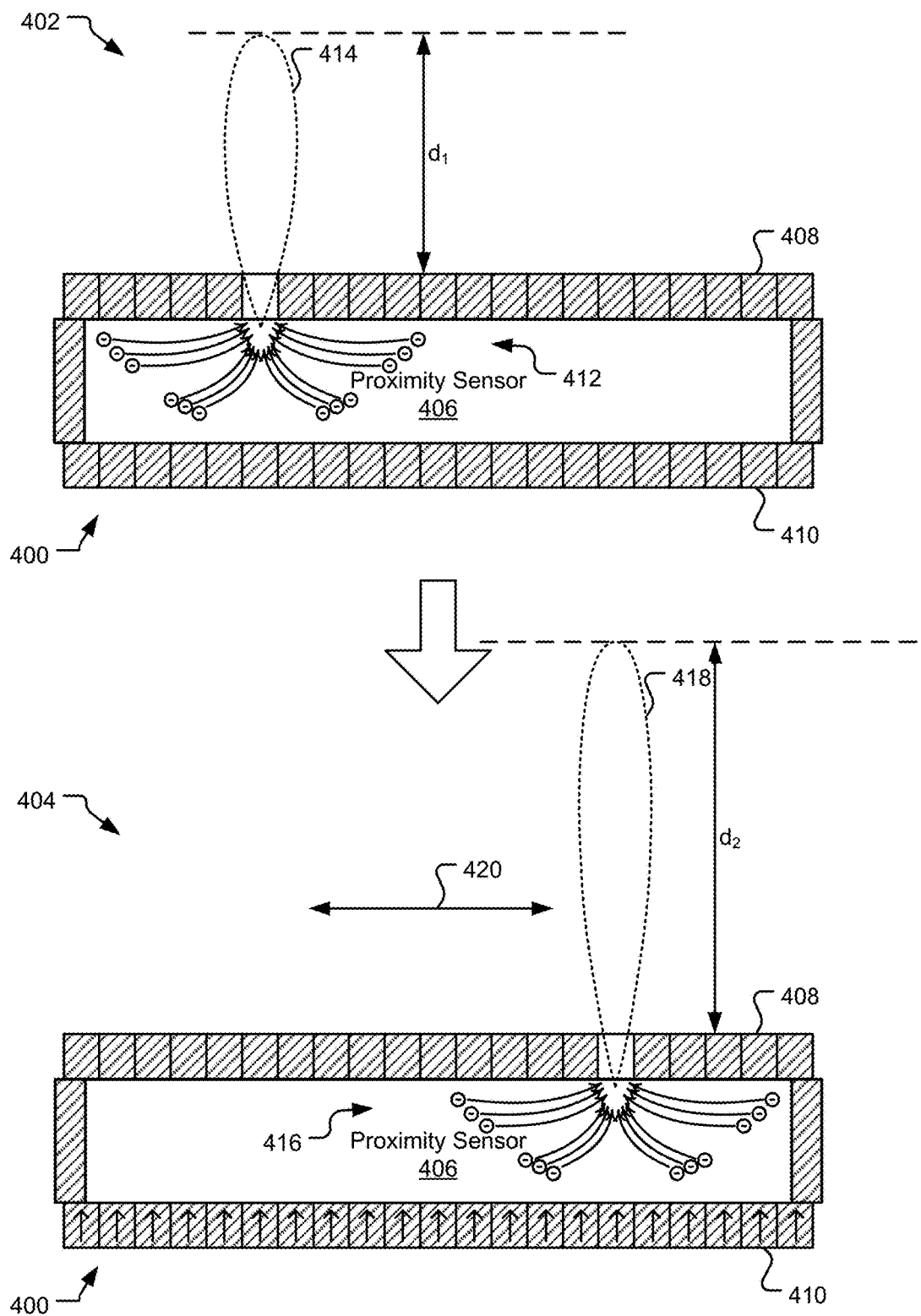
FIG. 4 illustrates an example active proximity sensor assembly with shielding shown in two states to depict example adaptive electric field control with back-side shield amplification.

FIG. 4 illustrates an example active proximity sensor assembly 400 with shielding shown in two states 402 and 404 to depict example adaptive electric field control with back-side shield amplification. In one implementation, an AC signal is input to a proximity sensor 406, and capacitive changes experienced by the proximity sensor 406 are monitored by a transmission power controller to adjust RF transmission power for SAR regulation compliance.

Two segmented electrodes 408 and 410 sandwich the proximity sensor 406 between them (with appropriate insulating layers), although the two segmented electrodes 408 and 410 may be combined into a single segmented electrode. In one implementation, each segment of the segmented electrodes 408 and 410 is controlled by a distinct signal line from a electric field controller so that the individual segments are individually controlled to operate as shield segments or window segments. It should be understood, however, that in some implementations, control of segments is not limited to individual segments. For example, a distinct signal line may control multiple segments such that a single line can set multiple segments as shield segments or window segments.

In state 402, the cross-hatched segments are turned "on" to configure them as shield segments to shield the electric field from emanating from the proximity sensor 406 through the shield segments. The non-cross-hatched segment is turned "off" to configure it as a window segment to allow the electric field to emanate from the proximity sensor 406 through the window segment. The combination of the shield and window segments concentrates the point charges 412 within the proximity sensor 406 near the window segment, resulting in an amplified electric field 414 that is directed through the window segment into the exterior volume around the proximity sensor assembly 400. As such, the proximity detection field distance $d_1$ is increased in comparison to a non-amplifying proximity sensor assembly.

In state 404, the cross-hatched segments are turned "on" to configure them as shield segments to shield the electric field from emanating from the proximity sensor 406 through the shield segments. The non-cross-hatched segment is turned "off" to configure it as a window segment to allow the electric field to emanate from the proximity sensor 406 through the window segment. However, in contrast to state 402, shield segments of the segmented electrode 410 are driven with an AC voltage that is greater in magnitude than the shield segments of the segmented electrode 408, which causes the shield segments of the segmented electrode 410 to more strongly repel point charges in the proximity sensor 406 than the shield segments of the segmented electrode 408. For example, if the proximity sensor 406 and shield segments of the segmented electrode 408 are supplied with a 0 to 3.6 volt AC signal, the amplified shield segments of the segmented electrode 410 could be supplied by a 0 to 4.0-4.6 volt AC signal. As a result, the concentration of point charges at the floating window segment is stronger than in the state 402, causing an even stronger amplification of the electric field through the window segment. The combination of the shield and window segments concentrates the point charges 416 within the proximity sensor 406 near the window segment, resulting in an amplified electric field 418 that is directed through the window segment into the exterior volume around the proximity sensor assembly 400. As such, the proximity detection field distance $d_2$ is increased in comparison to a non-amplifying proximity sensor assembly and in comparison to the state 402, which lacks the backside shield amplification (e.g., $d_2 > d_1$).

By changing the segments operating as shield segments versus windows segments, the amplified electric field can be scanned (as shown by arrow 420) back and forth across the proximity sensor assembly 400 to monitor proximity within an integrated volume exterior to the proximity sensor assembly 400 over time. FIG. 4 illustrates two states of such an example scanning process, but it should be understood that various scanning processes may be employed including without limitation sequential scanning across the proximity sensor assembly 400 (e.g., one sequential window segment at a time, multiple sequential window segments at a time) and non-sequential scanning across the proximity sensor assembly 400 (e.g., one random window segment at a time, multiple random window segments at a time). Further, window segments may be operated in one or both of the segmented electrodes 408 and 410 (e.g., to allow proximity detection out of both sides of the proximity sensor assembly 406).

Figure 5:
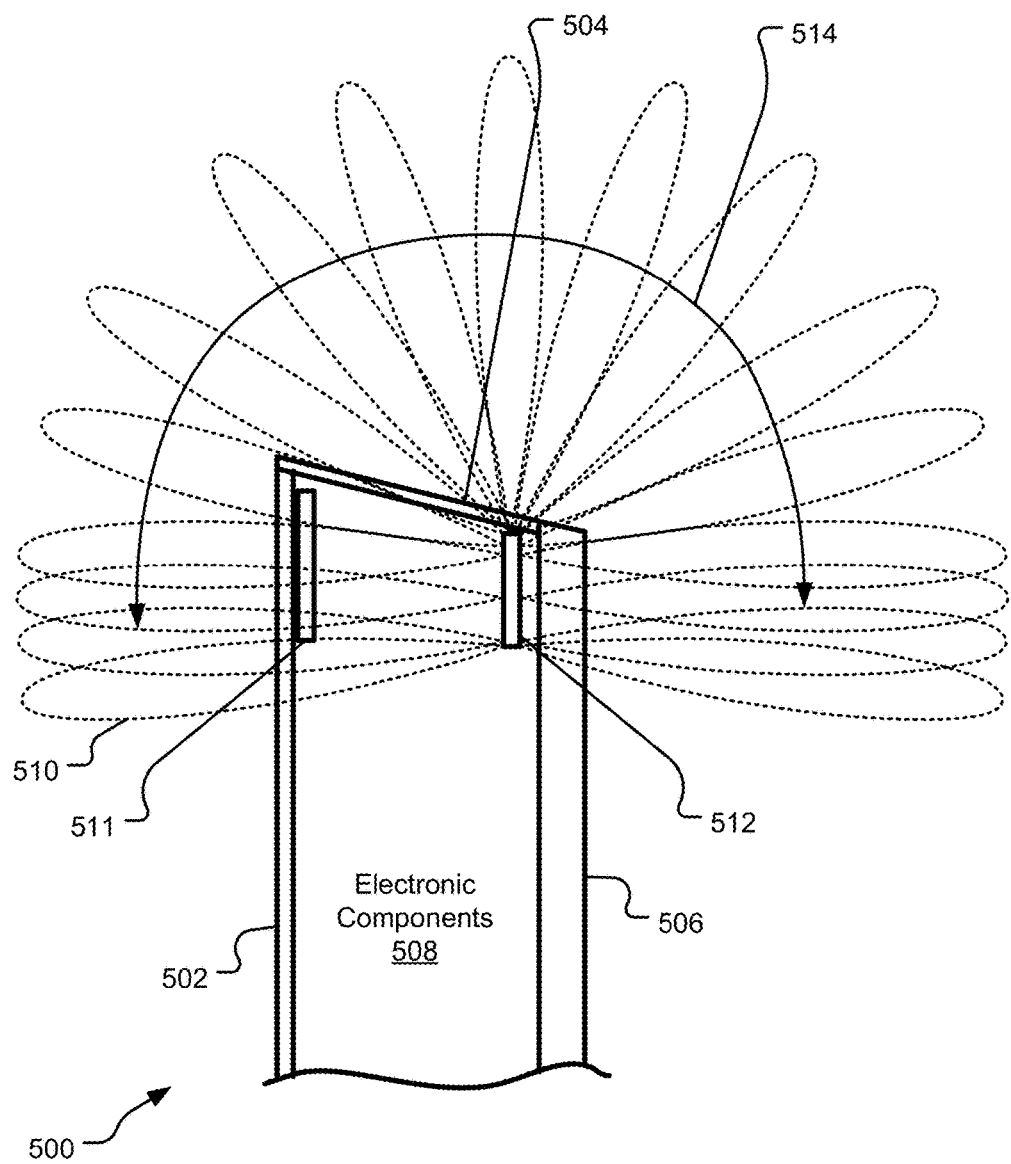
FIG. 5 illustrates a cross-sectional view of an electronic device depicting adaptive electric field control.

FIG. 5 illustrates a cross-sectional view of an electronic device 500 depicting adaptive electric field control, as viewed looking along a thin edge of the electronic device 500. The electronic device 500 includes a cover glass front surface 502 (e.g., as a component of a display assembly), a plastic top surface 504, and a back surface 506. The electronic device 500 contains electronic components 508, a radiofrequency (RF) antenna 511, and a proximity sensor assembly 512.

The proximity sensor assembly 512 includes one or more segmented electrodes positioned relative to a proximity sensor to allow a three-dimensional directed and amplified electric field 510 to scan along a dimension of the proximity sensor assembly 512. As shown in FIG. 5, the scanning electric field scans in an X-Y plane of FIG. 5, as shown by curved arrow 514. In this configuration, the three-dimensional character of the scanning electric field 510 causes the electric field 510 to also extend along a Z-axis orthogonal to the X-Y plane. In other implementations, the scanning may be performed along a different axis or in a different plane, with the three-dimensional character of the scanning electric field extending along a different orthogonal axis.

In at least one implementation, the scanning electric field 510 extends through a window segment of a segmented electrode, being concentrated by repelling point charges within the proximity sensor away from shield segments and toward the window segment. In such implementations, the electric field 510 is amplified by the concentrated point charges and directed by the position of the window segment.

In at least one alternative implementation, differential driving signals applied to at least two segments of a segmented electrode direct and amplify an electric field (see, e.g., FIG. 7). By varying the relative strengths of the driving signals applied to the at least two segments of the segmented electrode, the electric field 510 can be scanned along at least one dimension of the proximity sensor assembly 512.

Figure 6:
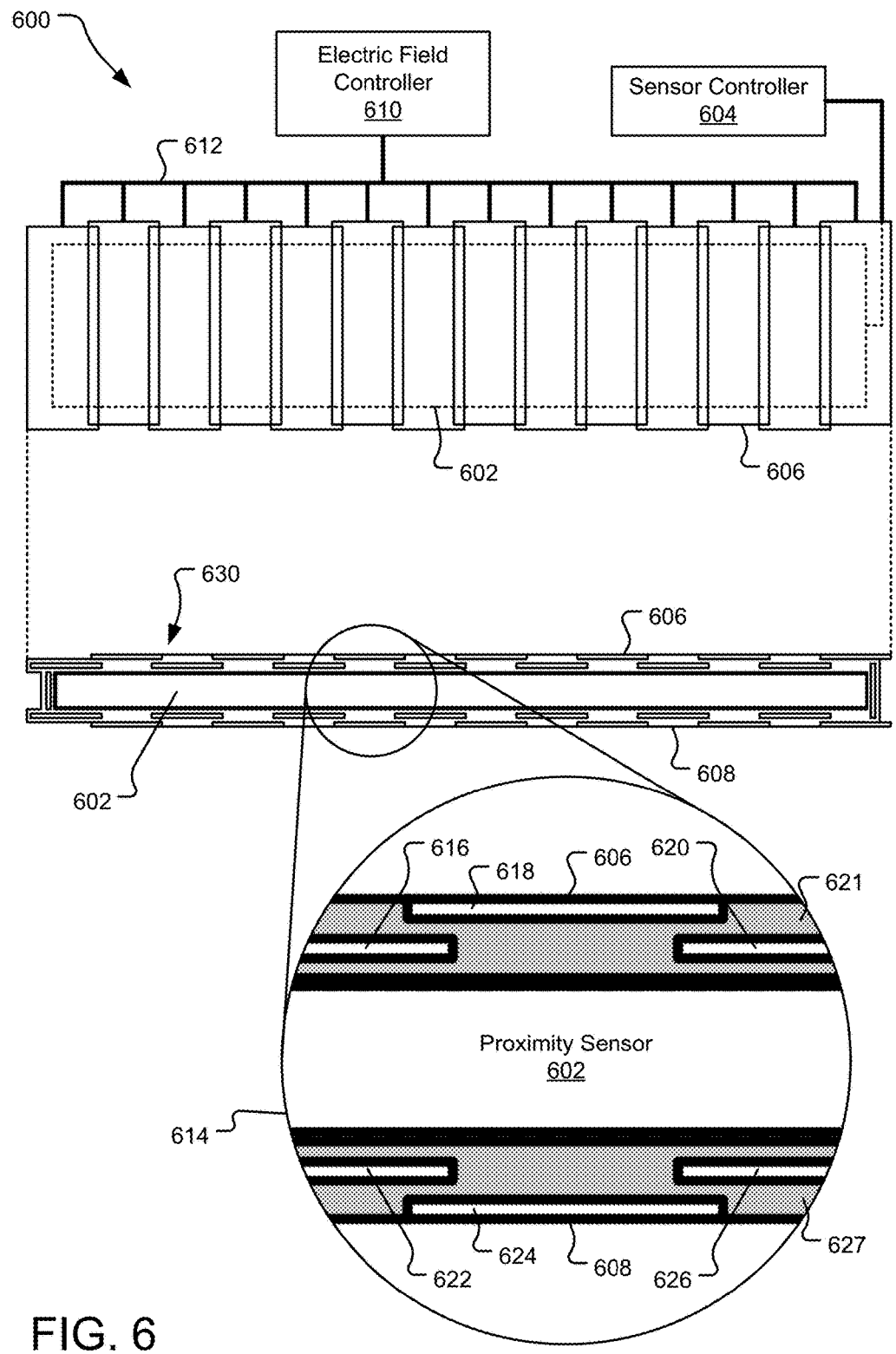
FIG. 6 illustrates a plan view of an example active proximity sensor assembly and a cross-sectional view of the example active proximity sensor assembly.

FIG. 6 illustrates a plan view of an example active proximity sensor assembly 600, and a cross-sectional view of the example active proximity sensor assembly 600. The example active proximity sensor assembly 600 includes a proximity sensor 602, controlled by a sensor controller 604, and individual segments of two segmented electrodes 606 and 608, driven (or allowed to float) by an electric field controller 610 via a control bus 612.

Example individual segments of the segmented electrode 606 are shown in the magnified view 614 as segments 616, 618, and 620. The individual segments of the segmented electrode 606 are insulated from each other and from the proximity sensor 602 by an insulating layer 621 (e.g., made of polyimide or another insulating material). Example individual segments of the segmented electrode 608 are shown in the magnified view 614 as segments 622, 624, and 626. The individual segments of the segmented electrode 606 are insulated from each other and from the proximity sensor 602 by an insulating layer 627 (e.g., made of polyimide or another insulating material). Individual segments of each segmented electrode are also in overlapping contact with the corresponding insulating layer and are overlapping the proximity sensor 602. Further, the insulating layers 621 and 627 are in overlapping contact with the proximity sensor 602.

In combination, the segmented electrodes 606 and 608, the insulating layers 621 and 627, and the proximity sensor 602 form an example proximity sensor assembly, although other configurations are contemplated (see, e.g., FIG. 7). For example, a single segmented electrode and a single insulating layer may be employed. In another example, rather than employing electrode segments that overlap each other (see overlap 630), one implementation may include a segmented electrode with tightly abutted segments (e.g., in a single layer), separated by a thin insulating layer.

FIG. 7 illustrates an alternative active proximity sensor assembly 700 with a segmented electrode having two segments 702 and 704, in two different states 706 and 708. In one implementation, an AC signal is input to a proximity sensor 710, and capacitive changes experienced by the proximity sensor 710 are monitored by a transmission power controller to adjust RF transmission power for SAR regulation compliance.

Two electrode segments 702 and 704 are positioned along one or more sides of the proximity sensor 710, separated and in overlapping contact with an insulating layer 718 between the segments themselves and between the segments and the proximity sensor 710. In one implementation, each segment 702 and 704 is controlled by distinct signal lines 712 and 714 (or a bus) from an electric field controller 716 so that the individual segments are individually controlled to operate differentially directing and amplifying influence on the electric field of the proximity sensor 710. It should be understood, however, that in some implementations, the segmented electrode may include more than two segments, and control of segments is not limited to individual segments. For example, a distinct signal line may control multiple segments such that a single line can set multiple segments as relatively differential directing segment groups.

In the state 706, the segment 702 is driven with more voltage than the segment 704, causing the point charges 717 in the proximity sensor 710 to concentrate in the right half of the proximity sensor 710. The resulting electric field 720 is directed and amplified to the right of the proximity sensor 710. In the state 708, the segment 704 is driven with more voltage than the segment 702, causing the point charges 717 in the proximity sensor 710 to concentrate in the left half of the proximity sensor 710. The resulting electronic electric field 720 is directed and amplified to the left of the proximity sensor 710. The differential between the voltage strengths applied to the segments 702 and 704 can be varied to cause the directed and amplified electric field 720 to sweep from left to right along a dimension of the proximity sensor 710. The combination of the differentially driven segments concentrates the point charges 717 within the proximity sensor 710, resulting in an amplified electric field 720 to be directed into the exterior volume around the proximity sensor assembly.

Figure 8:
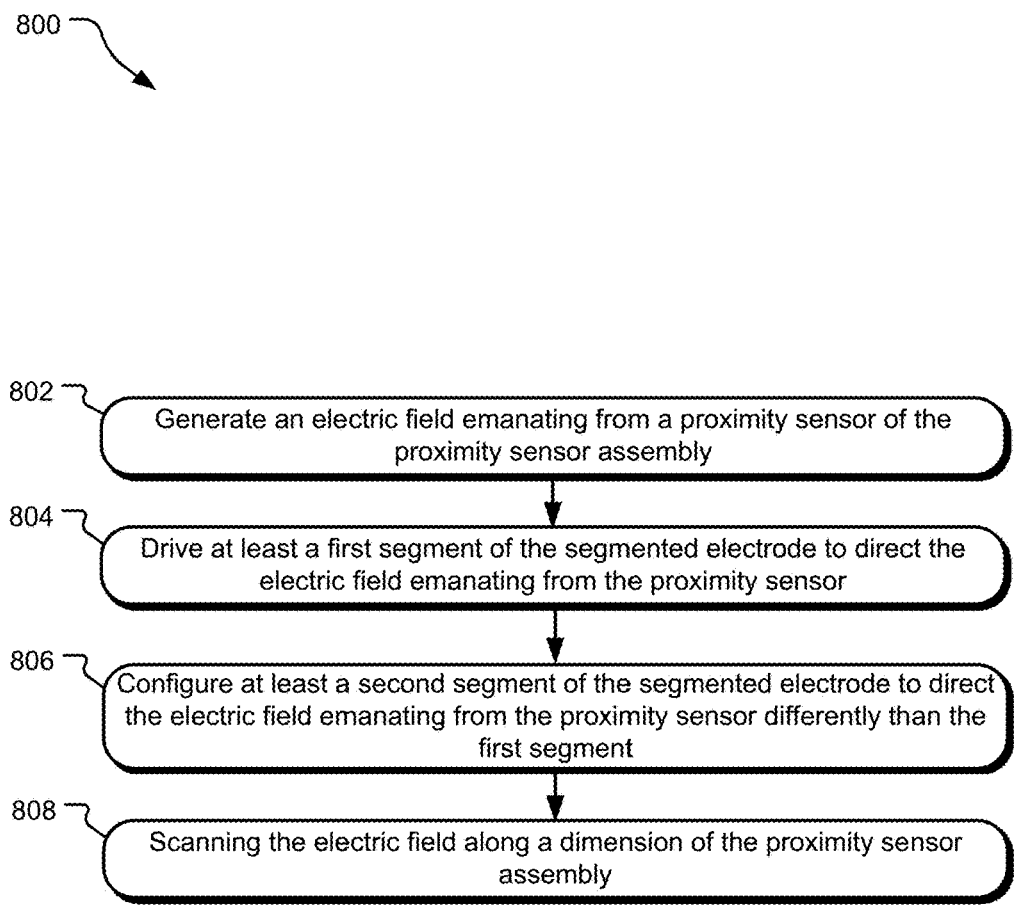
FIG. 8 illustrates example operations for adaptive electric field control of an active proximity sensor.

FIG. 8 illustrates example operations 800 for adaptive electric field control of an active proximity sensor. A generating operation 802 generates an electric field emanating from a proximity sensor of the proximity sensor assembly. In one implementation, the electric field is generated by supplying an AC voltage to a conductive plate, although configurations of proximity sensors are contemplated (e.g., curved, spherical, multi-sided).

A directing operation 804 drives (e.g., supplies voltage to) at least a first segment of the segmented electrode to direct the electric field emanating from the proximity sensor. Another directing operation 806 configures (e.g., supplies voltage to or allows a floating potential on) at least a second segment of the segmented electrode to direct the electric field emanating from the proximity sensor differently than the first segment. In one implementation, the first segment is configured to operate as a shield segment in a first sweep time period to shield the electric field generated by point charges in the proximity sensor from emanating through the shield segment, and the second segment is configured as a window segment in the first sweep time period to allow the electric field generated by the point charges in the proximity sensor to emanate through the window segment from the proximity sensor assembly. In another implementation, the first and second segments are concurrently driven. The first segment is driven to operate as a first electric field directing segment to direct the electric field generated by point charges in the proximity sensor, and the second segment is driven as a second electric field directing segment to direct the electric field generated by the point charges in the proximity sensor.

A scanning operation 808 scans the electric field along a dimension of the proximity sensor assembly. In one implementation, for example, a third segment in overlapping contact with the insulating layer and overlapping the proximity sensor. A first segment and A second segment are configured as shield segments in a second sweep time period, and the third segment is configured as a window segment in the second sweep time period. In another implementation, for example, a first electric field directing segment is driven differently than a second electric field directing segment over the sequence of sweep time periods to angularly sweep the electric field along at least one dimension of the proximity sensor assembly over the sequence of sweep time periods.

The implementations described herein are implemented as logical steps in one or more processor-based systems. The logical operations may be implemented (1) as a sequence of processor-implemented steps executing in one or more processor-based systems and (2) as interconnected machine or circuit modules within one or more processor-based systems. The implementation is a matter of choice, dependent on the performance requirements of the processor-based system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language.

An example proximity sensor assembly includes a proximity sensor configured to generate an electric field emanating from the proximity sensor assembly. An insulating layer is positioned in overlapping contact with at least one surface of the proximity sensor. A segmented electrode having two or more segments is positioned in overlapping contact with the insulating layer, also overlapping the proximity sensor. At least a first segment of the segmented electrode is configured to direct the electric field emanating from the proximity sensor, and at least a second segment of the segmented electrode is configured to direct the electric field emanating from the proximity sensor differently than the first segment.

Another example proximity sensor assembly of any preceding proximity sensor assembly is configured such that the first segment and the second segment overlap the proximity sensor at different locations of the proximity sensor.

Another example proximity sensor assembly of any preceding proximity sensor assembly is configured such that the first segment is driven to operate as a shield segment in a first sweep time period to shield the electric field generated by point charges in the proximity sensor from emanating through the shield segment and the second segment is configured as a window segment in the first sweep time period to allow the electric field generated by the point charges in the proximity sensor to emanate through the window segment from the proximity sensor assembly.

Another example proximity sensor assembly of any preceding proximity sensor assembly is configured such that the proximity sensor assembly is configured to concentrate the point charges in proximity to the window segment.

Another example proximity sensor assembly of any preceding proximity sensor assembly is configured such that the two or more segments of the segmented electrode are configured to concentrate the point charges in proximity to the window segment, relative to the shield segment, concentration of the point charge amplifying the electric field emanating through the window segment.

Another example proximity sensor assembly of any preceding proximity sensor assembly is configured such that the two or more segments of the segmented electrode are configured to be toggled between a shield segment and a window segment at different sweep time periods.

Another example proximity sensor assembly of any preceding proximity sensor assembly is configured such that the segmented electrode includes a third segment in overlapping contact with the insulating layer and overlapping the proximity sensor. The first segment and the second segment are configured as shield segments in a second sweep time period. The third segment is configured as a window segment in the second sweep time period.

Another example proximity sensor assembly of any preceding proximity sensor assembly is configured such that the two or more segments of the segmented electrode are configured to sweep the window segment along at least one dimension of the proximity sensor assembly over a sequence of sweep time periods.

Another example proximity sensor assembly of any preceding proximity sensor assembly is configured such that the first and second segments are concurrently driven. The first segment is driven to operate as a first electric field directing segment to direct the electric field generated by point charges in the proximity sensor, and the second segment is driven as a second electric field directing segment to direct the electric field generated by the point charges in the proximity sensor.

Another example proximity sensor assembly of any preceding proximity sensor assembly is configured such that the first electric field directing segment is driven differently than the second electric field directing segment to steer the electric field generated by the point charges in the proximity sensor.

Another example proximity sensor assembly of any preceding proximity sensor assembly is configured such that the first electric field directing segment is driven differently than the second electric field directing segment over the sequence of sweep time periods to angularly sweep the electric field along at least one dimension of the proximity sensor assembly.

An example method includes generating an electric field emanating from a proximity sensor of a proximity sensor assembly and directing the electric field emanating from the proximity sensor of the proximity sensor assembly via a segmented electrode having two or more segments overlapping at least one surface of the proximity sensor and being in overlapping contact with an insulating layer. The insulating layer is positioned between and in overlapping contact with the proximity sensor and the segmented electrode.

Another example method of any preceding method operates such that at least a first segment of the segmented electrode directs the electric field emanating from the proximity sensor and at least a second segment of the segmented electrode directs the electric field emanating from the proximity sensor differently than the first segment.

Another example method of any preceding method operates such that the directing operation includes driving at least a first segment of the segmented electrode to operate as a shield segment in a first sweep time period to shield the electric field generated by point charges in the proximity sensor from emanating through the shield segment and configuring at least a second segment of the segmented electrode as a window segment in the first sweep time period to allow the electric field generated by the point charges in the proximity sensor to emanate through the window segment from the proximity sensor assembly.

Another example method of any preceding method operates such that the directing operation includes amplifying the electric field emanating through the window segment by driving at least one shield segment of the segmented electrode to concentrate the point charges in proximity to the window segment.

Another example method of any preceding method operates such that the directing operation further includes driving the first segment of the segmented electrode to operate as a shield segment in a second sweep time period to shield the electric field generated by point charges in the proximity sensor from emanating through the first segment, driving the second segment of the segmented electrode as a shield segment in the second sweep time period to shield the electric field generated by point charges in the proximity sensor from emanating through the second segment, and configuring a third segment of the segmented electrode as a window segment in the second sweep time period to allow the electric field generated by the point charges in the proximity sensor to emanate through the third segment from the proximity sensor assembly. The third segment is in overlapping contact with the insulating layer and overlapping the proximity sensor.

Another example method of any preceding method operates such that the two or more segments of the segmented electrode are configured to sweep the window segment along at least one dimension of the proximity sensor assembly over a sequence of sweep time periods.

Another example method of any preceding method operates such that further including driving the first and second segments concurrently. The first segment is driven to operate as a first electric field directing segment to direct the electric field generated by point charges in the proximity sensor, and the second segment is driven as a second electric field directing segment to direct the electric field generated by the point charges in the proximity sensor.

Another example method of any preceding method operates such that the operation of driving includes driving the first electric field directing segment differently than the second electric field directing segment over a sequence of sweep time periods to angularly sweep the electric field along at least one dimension of the proximity sensor assembly.

Another proximity sensor assembly includes means for generating an electric field emanating from the proximity sensor assembly and means for directing the electric field emanating from the proximity sensor assembly.

Another example proximity sensor assembly includes means for generating an electric field emanating from a proximity sensor of a proximity sensor assembly and means for directing the electric field emanating from the proximity sensor of the proximity sensor assembly via a segmented electrode having two or more segments overlapping at least one surface of the proximity sensor and being in overlapping contact with an insulating layer. The insulating layer is positioned between and in overlapping contact with the proximity sensor and the segmented electrode.

Another example proximity sensor assembly of any preceding proximity sensor assembly includes at least a first segment of the segmented electrode that directs the electric field emanating from the proximity sensor and at least a second segment of the segmented electrode that directs the electric field emanating from the proximity sensor differently than the first segment.

Another example proximity sensor assembly of any preceding proximity sensor assembly includes means for driving at least a first segment of the segmented electrode to operate as a shield segment in a first sweep time period to shield the electric field generated by point charges in the proximity sensor from emanating through the shield segment and means for configuring at least a second segment of the segmented electrode as a window segment in the first sweep time period to allow the electric field generated by the point charges in the proximity sensor to emanate through the window segment from the proximity sensor assembly.

Another example proximity sensor assembly of any preceding proximity sensor assembly includes means for amplifying the electric field emanating through the window segment by driving at least one shield segment of the segmented electrode to concentrate the point charges in proximity to the window segment.

Another example proximity sensor assembly of any preceding proximity sensor assembly includes means for driving the first segment of the segmented electrode to operate as a shield segment in a second sweep time period to shield the electric field generated by point charges in the proximity sensor from emanating through the first segment, means for driving the second segment of the segmented electrode as a shield segment in the second sweep time period to shield the electric field generated by point charges in the proximity sensor from emanating through the second segment, and means for configuring a third segment of the segmented electrode as a window segment in the second sweep time period to allow the electric field generated by the point charges in the proximity sensor to emanate through the third segment from the proximity sensor assembly. The third segment is in overlapping contact with the insulating layer and overlapping the proximity sensor.

Another example proximity sensor assembly of any preceding proximity sensor assembly provides that the two or more segments of the segmented electrode are configured to sweep the window segment along at least one dimension of the proximity sensor assembly over a sequence of sweep time periods.

Another example proximity sensor assembly of any preceding proximity sensor assembly includes means for driving the first and second segments concurrently. The first segment is driven to operate as a first electric field directing segment to direct the electric field generated by point charges in the proximity sensor, and the second segment is driven as a second electric field directing segment to direct the electric field generated by the point charges in the proximity sensor.

Another example proximity sensor assembly of any preceding proximity sensor assembly includes means for driving the first electric field directing segment differently than the second electric field directing segment over a sequence of sweep time periods to angularly sweep the electric field along at least one dimension of the proximity sensor assembly.

The above specification, examples, along with the following claims, provide a complete description of the structure and use of exemplary implementations of the technology.

What is claimed is:

1. A proximity sensor assembly comprising:
   a proximity sensor configured to generate an electric field emanating from the proximity sensor assembly, the proximity sensor having a first side surface, a second opposite side surface, and a sensor pad having an applied conductive material;
   an insulating layer in overlapping contact with the first side surface of the proximity sensor; and
   a segmented electrode having two or more segments, the two or more segments in overlapping contact with the insulating layer and overlapping the applied conductive material of the sensor pad at the first side surface of the proximity sensor, at least a first segment of the segmented electrode being configured to direct the electric field emanating from the proximity sensor and at least a second segment of the segmented electrode being configured to direct the electric field emanating from the proximity sensor differently than the first segment by repelling point charges through the applied conductive material from the first segment and concentrating the point charges in the applied conductive material at the second segment.

2. The proximity sensor assembly of claim 1 wherein the first segment and the second segment overlap the proximity sensor at different locations of the proximity sensor.

3. The proximity sensor assembly of claim 1 wherein the first segment is driven to operate as a shield segment in a first sweep time period to shield the electric field generated by the point charges in the proximity sensor from emanating through the shield segment and the second segment is configured as a window segment in the first sweep time period to allow the electric field generated by the point charges in the proximity sensor to emanate through the window segment from the proximity sensor assembly.

4. The proximity sensor assembly of claim 3 wherein the proximity sensor assembly is configured to concentrate the point charges in proximity to the window segment.

5. The proximity sensor assembly of claim 3 wherein the proximity sensor assembly is configured to concentrate the point charges in proximity to the window segment, concentration of the point charge amplifying the electric field emanating through the window segment.

6. The proximity sensor assembly of claim 3 wherein the two or more segments of the segmented electrode are configured to be toggled between a shield segment and a window segment at different sweep time periods.

7. The proximity sensor assembly of claim 3 wherein the segmented electrode includes a third segment in overlapping contact with the insulating layer and overlapping the first side surface of the proximity sensor, the first segment and the second segment being configured as shield segments in a second sweep time period, the third segment configured as a window segment in the second sweep time period.

8. The proximity sensor assembly of claim 3 wherein the proximity sensor assembly is configured to sweep the window segment along at least one dimension of the proximity sensor assembly over a sequence of sweep time periods.

9. The proximity sensor assembly of claim 1 wherein the first segment and the second segment are concurrently driven, the first segment being driven to operate as a first electric field directing segment to direct the electric field generated by the point charges in the proximity sensor and the second segment being driven as a second electric field directing segment to direct the electric field generated by the point charges in the proximity sensor.

10. The proximity sensor assembly of claim 9 wherein the first electric field directing segment is driven differently than the second electric field directing segment to steer the electric field generated by the point charges in the proximity sensor.

11. The proximity sensor assembly of claim 9 wherein the first electric field directing segment is driven differently than the second electric field directing segment over a sequence of sweep time periods to angularly sweep the electric field along at least one dimension of the proximity sensor assembly.

12. A method comprising:
   generating an electric field emanating from a proximity sensor of a proximity sensor assembly, the proximity sensor having a first side surface, a second opposite side surface, and a sensor pad having an applied conductive material; and
   directing the electric field emanating from the proximity sensor of the proximity sensor assembly via a segmented electrode having two or more segments overlapping at least the applied conductive material of one surface of the sensor pad of the proximity sensor and being in overlapping contact with an insulating layer, the insulating layer being between and in overlapping contact with the proximity sensor and the segmented electrode, the two or more segments including a window segment and a shield segment, the directing including repelling point charges through the applied conductive material of the proximity sensor from the shield segment and concentrating the point charges in the applied conductive material at the window segment.

13. The method of claim 12 wherein at least a first segment of the segmented electrode directs the electric field emanating from the proximity sensor and at least a second segment of the segmented electrode directs the electric field emanating from the proximity sensor differently than the first segment.

14. The method of claim 12 wherein the directing operation comprises:
  driving at least a first segment of the segmented electrode to operate as the shield segment in a first sweep time period to shield the electric field generated by the point charges in the proximity sensor from emanating through the shield segment; and
  configuring at least a second segment of the segmented electrode as the window segment in the first sweep time period to allow the electric field generated by the point charges in the proximity sensor to emanate through the window segment from the proximity sensor assembly.

15. The method of claim 14 wherein the directing operation further comprises:
  amplifying the electric field emanating through the window segment by driving at least one shield segment of the segmented electrode to concentrate the point charges in proximity to the window segment.

16. The method of claim 14 wherein the directing operation further comprises:
  driving the first segment of the segmented electrode to operate as a shield segment in a second sweep time period to shield the electric field generated by the point charges in the proximity sensor from emanating through the first segment;
  driving the second segment of the segmented electrode as a shield segment in the second sweep time period to shield the electric field generated by the point charges in the proximity sensor from emanating through the second segment; and
  configuring a third segment of the segmented electrode as a window segment in the second sweep time period to allow the electric field generated by the point charges in the proximity sensor to emanate through the third segment from the proximity sensor assembly, the third segment being in overlapping contact with the insulating layer and overlapping the proximity sensor.

17. The method of claim 14 wherein the proximity sensor assembly is configured to sweep the window segment along at least one dimension of the proximity sensor assembly over a sequence of sweep time periods.

18. The method of claim 12 further comprising:
  driving a first segment and a second segment of the segmented electrode concurrently, the first segment being driven to operate as a first electric field directing segment to direct the electric field generated by the point charges in the proximity sensor and the second segment being driven as a second electric field directing segment to direct the electric field generated by the point charges in the proximity sensor.

19. The method of claim 18 wherein the driving operation comprises:
  driving the first electric field directing segment differently than the second electric field directing segment over a sequence of sweep time periods to angularly sweep the electric field along at least one dimension of the proximity sensor assembly.

20. A proximity sensor assembly comprising:
  means for generating an electric field emanating from the proximity sensor assembly; and
  means for directing the electric field emanating from the proximity sensor assembly.

* * * * *